(12) United States Patent
Sato

(10) Patent No.: US 11,356,057 B2
(45) Date of Patent: Jun. 7, 2022

(54) TEMPERATURE CONTROL CIRCUIT, OSCILLATION CONTROL CIRCUIT, AND TEMPERATURE CONTROL METHOD

(71) Applicant: ASAHI KASEI MICRODEVICES CORPORATION, Tokyo (JP)

(72) Inventor: Takayuki Sato, Tokyo (JP)

(73) Assignee: Asahi Kasei Microdevices Corporation, Tokyo (JP)

(*) Notice: Subject to any disclaimer, the term of this patent is extended or adjusted under 35 U.S.C. 154(b) by 111 days.

(21) Appl. No.: 17/029,675

(22) Filed: Sep. 23, 2020

(65) Prior Publication Data

US 2021/0119577 A1 Apr. 22, 2021

(30) Foreign Application Priority Data

Oct. 17, 2019 (JP) .............................. JP2019-190295

(51) Int. Cl.
*H03B 5/04* (2006.01)
*G01K 7/02* (2021.01)
*G01K 7/20* (2006.01)

(52) U.S. Cl.
CPC .............. *H03B 5/04* (2013.01); *G01K 7/021* (2013.01); *G01K 7/203* (2013.01)

(58) Field of Classification Search
CPC ...................................................... H03B 5/04
USPC ....................................................... 331/176
See application file for complete search history.

(56) References Cited

U.S. PATENT DOCUMENTS

| 6,501,340 | B1 | 12/2002 | Flood |
| 6,584,380 | B1 | 6/2003 | Nemoto |
| 7,154,351 | B2 | 12/2006 | Kawasaki |
| 7,253,694 | B2 | 8/2007 | Hardy et al. |
| 7,573,345 | B2 | 8/2009 | Hardy et al. |
| 7,741,924 | B2 | 6/2010 | Matsui et al. |
| 9,013,244 | B2 | 4/2015 | Tokuhashi |
| 9,154,139 | B2 | 10/2015 | Akaike et al. |

(Continued)

FOREIGN PATENT DOCUMENTS

| CN | 1257619 A | 6/2000 |
| CN | 101027839 A | 8/2007 |

(Continued)

*Primary Examiner* — Joseph Chang
(74) *Attorney, Agent, or Firm* — Morgan, Lewis & Bockius LLP

(57) ABSTRACT

In-package temperature is controlled with higher accuracy. To this end, a temperature control circuit includes a temperature sensor arranged in a package and detecting temperature in the package, a heater current detection circuit detecting a driving amount of a heater, a target temperature generation circuit generating a target temperature from an intended temperature of a resonator and a detection value of the driving amount detected by the heater current detection circuit, a heater current driver controlling the heater so that the detection temperature detected by the temperature sensor coincides with the target temperature, and an Nth-order correction circuit receiving the detection value of the driving amount detected by the heater current detection circuit or a signal based on the target temperature and cancelling influence of a second or higher order fluctuation component generated in the heater current detection circuit on temperature of the resonator.

11 Claims, 10 Drawing Sheets

(56) References Cited

U.S. PATENT DOCUMENTS

| | | |
|---|---|---|
| 10,141,887 B2 | 11/2018 | Akaike et al. |
| 10,270,452 B2 | 4/2019 | Fukuzawa |
| 2006/0012446 A1 | 1/2006 | Hardy et al. |
| 2007/0268079 A1 | 11/2007 | Hardy et al. |
| 2008/0297268 A1 | 12/2008 | Matsui et al. |
| 2011/0121909 A1* | 5/2011 | Isohata ............... H03L 1/026 331/176 |
| 2013/0314169 A1* | 11/2013 | Tokuhashi ............ H03L 1/04 331/176 |
| 2014/0210563 A1 | 7/2014 | Akaike et al. |
| 2014/0218119 A1* | 8/2014 | He ..................... H03L 1/022 331/17 |
| 2015/0061783 A1 | 3/2015 | Yorita |
| 2017/0040942 A1* | 2/2017 | Isohata ............... H03L 1/022 |
| 2017/0063305 A1 | 3/2017 | Shirotori et al. |
| 2017/0133984 A1 | 5/2017 | Akaike et al. |
| 2017/0141778 A1 | 5/2017 | Fukuzawa |
| 2018/0278256 A1 | 9/2018 | Hirose et al. |

FOREIGN PATENT DOCUMENTS

| | | |
|---|---|---|
| CN | 102025368 A | 4/2011 |
| CN | 102082548 A | 6/2011 |
| CN | 103427765 A | 12/2013 |
| CN | 103973223 A | 8/2014 |
| CN | 104426478 A | 3/2015 |
| CN | 106664060 A | 5/2017 |
| CN | 107017838 A | 8/2017 |
| CN | 213717927 U | 7/2021 |
| JP | 2008-300978 A | 12/2008 |
| JP | 2014-230201 A | 12/2014 |
| JP | 5977197 B2 | 8/2016 |
| JP | 2018-157369 A | 10/2018 |
| WO | 2016/080529 A1 | 5/2016 |

* cited by examiner

TEMPERATURE CONTROL CIRCUIT, OSCILLATION CONTROL CIRCUIT, AND TEMPERATURE CONTROL METHOD

CROSS REFERENCE TO RELATED APPLICATIONS AND INCORPORATION BY REFERENCE

This application claims benefit of priority under 35 USC 119 based on Japanese Patent Application No. 2019-190295 filed on Oct. 17, 2019, the entire contents of which are incorporated by reference herein.

TECHNICAL FIELD

The present invention relates to a temperature control circuit, an oscillation control circuit, and a temperature control method.

BACKGROUND ART

In general, reference clocks for base stations are required to suppress frequency temperature fluctuations to the order of tens to hundreds of ppb. A crystal oscillator (XO) using a quartz crystal unit (Xtal) is generally used as a clock source for reference clock. For example, in a range of from −40° C. to 85° C., frequency temperature fluctuation in the quartz crystal unit is large, such as several tens of ppm.

Thus, an oven controlled Xtal oscillator (OCXO), which maintains the temperature of a quartz crystal unit at a constant level, is generally used to suppress frequency temperature fluctuation in the quartz crystal unit.

In the OCXO, for example, as illustrated in FIG. 17, a differential amplifier 102 is arranged to form a thermal feedback loop so that a temperature Vsens detected by a temperature sensor 101 coincides with a target temperature Vgt that is a constant voltage, and, in response to an output of the differential amplifier 102, a PMOS element serving as a current driver 103 is controlled to apply a predetermined heater current Ih. This causes heat generation of heater, and the heat generation allows temperature in a package 105 including a quartz crystal unit 104 to be constant. Additionally, the temperature sensor 101, the differential amplifier 102, the current driver 103, and a control circuit controlling the quartz crystal unit 104 in the crystal oscillator are configured to form an integrated circuit IC.

Here, in the thermal control illustrated in FIG. 17, the output temperature of the temperature sensor 101 is constant with respect to change in the ambient temperature, but the temperature of the quartz crystal unit 104 is not. Thus, actually the temperature of the quartz crystal unit 104 changes in the order of several degrees centigrade (° C.). This principle will be described using a thermal resistance model illustrated in FIG. 18.

In the thermal resistance model in the package 105 illustrated in FIG. 18, with respect to an ambient temperature Ta [° C.], the temperature of the integrated circuit IC (hereinafter referred to as IC temperature) in which the current driver 103 of the heater, the control circuit of the quartz crystal unit 104, and the like are mounted is defined as Ti [° C.], the temperature of the quartz crystal unit 104 (hereinafter referred to as crystal unit temperature) is defined as Tx [° C.], and power consumption of the integrated circuit IC is defined as Pi[W]. Additionally, a thermal resistance between an outside air and the integrated circuit IC is defined as θai [° C./W], a thermal resistance between the outside air and the quartz crystal unit 104 is defined as θax [° C./W], and a thermal resistance between the integrated circuit IC and the quartz crystal unit 104 is defined as θix[° C./W].

First, the IC temperature Ti is controlled to an intended value Tgt by thermal feedback, therefore, Ti=Tgt (constant).

On the other hand, by dividing the IC temperature Ti (=Tgt) and the ambient temperature Ta by the thermal resistances θix and θax, the crystal unit temperature Tx can be expressed by the following equation (1):

$$Tx=\{(\theta ax/(\theta ix+\theta ax)\}\times Tgt+\{(\theta ix/(\theta ix+\theta ax)\}\times Ta \qquad (1)$$

In other words, in response to fluctuation of the ambient temperature Ta, the crystal unit temperature Tx exhibits a first-order change. For example, when Tgt=98 [° C.], θai=300 [° C./W], θax=295 [° C./W], and θix=5 [° C./W], the temperature fluctuation in the quartz crystal unit 104 reaches as much as about 2 [° C.].

Even if an SC-cut Xtal having a small frequency temperature fluctuation near a turnover temperature where frequency temperature characteristics thereof are at an extreme value is used as the quartz crystal unit 104, the frequency temperature characteristics of the SC-cut Xtal are at a temperature distant from the extreme value by a several degrees centigrade (° C.), for example, about 100 [ppb/° C.]. Therefore, a frequency fluctuation caused by a crystal unit temperature fluctuation of about 2 [° C.] is about 200 [ppb]. For example, with a Stratum 3E-based reference clock, a requirement for free-running frequency fluctuation (holdover characteristics) is said to be 10 [ppb] per day, which cannot be satisfied by the thermal resistance model illustrated in FIG. 18. Thus, in ordinary OCXOs, crystal unit temperature exhibits first-order fluctuations, thereby causing large frequency temperature fluctuations.

Therefore, for example, a method for suppressing frequency temperature fluctuations by shifting the target temperature Vgt by using a first-order correction component in proportion to a difference between the target temperature Vgt and the ambient temperature Ta has been proposed (for example, see JP 5977197 B).

SUMMARY

However, when trying to achieve the conventional technology using a real circuit, the target temperature of the IC cannot be sufficiently corrected in first order, and a nonlinear error component (an Nth high-order component) remains. This results in degradation of frequency temperature fluctuation characteristics.

Accordingly, the present invention has been made in view of the conventional unsolved problem described above, and it is an object of the present invention to provide a temperature control circuit, an oscillation control circuit, and a temperature control method that are capable of performing temperature control with higher accuracy.

According to an aspect of the present invention, there is provided a temperature control circuit of a module including a target object and a heat generation circuit stored in a package, the temperature control circuit including: a temperature sensor arranged in the package and configured to detect temperature in the package; a driving amount detection circuit configured to detect a driving amount of the heat generation circuit; a target temperature generation circuit configured to generate a target temperature from an intended temperature of the target object and a detection value of the driving amount detected by the driving amount detection circuit; a drive circuit configured to control the driving amount so that the detection temperature detected by the temperature sensor coincides with the target temperature; and a cancellation circuit configured to receive the detection value of the driving amount or a signal based on the target temperature and cancel influence of a second or higher order fluctuation component generated in the driving amount detection circuit on temperature of the target object.

According to another aspect of the present invention, there is provided an oscillation control circuit including the temperature control circuit of the noted aspect, a resonator that is the target object arranged in the package, and an oscillation circuit configured to control the resonator.

According to still another aspect of the present invention, there is provided a temperature control method for a module including a target object and a heat generation circuit stored in a package, the temperature control method including: detecting, by a temperature sensor arranged in the package, temperature in the package; detecting, by a driving amount detection circuit, a driving amount of the heat generation circuit; generating, by a target temperature generation circuit, a target temperature from an intended temperature of the target object and a detection value of the driving amount detected by the driving amount detection circuit; controlling, by a drive circuit, the driving amount so that the detection temperature detected by the temperature sensor coincides with the target temperature; and canceling influence of a second or higher order fluctuation component generated in the driving amount detection circuit on temperature of the target object by adjusting the detection signal of the temperature sensor or the target temperature using the detection value of the driving amount or a signal based on the target temperature.

According to an aspect of the present invention, temperature control can be performed with higher accuracy. For example, the oscillation control circuit can further suppress frequency temperature fluctuations due to temperature fluctuations, thereby enabling further improvement in the accuracy of oscillation control.

DETAILED DESCRIPTION

Figure 1:
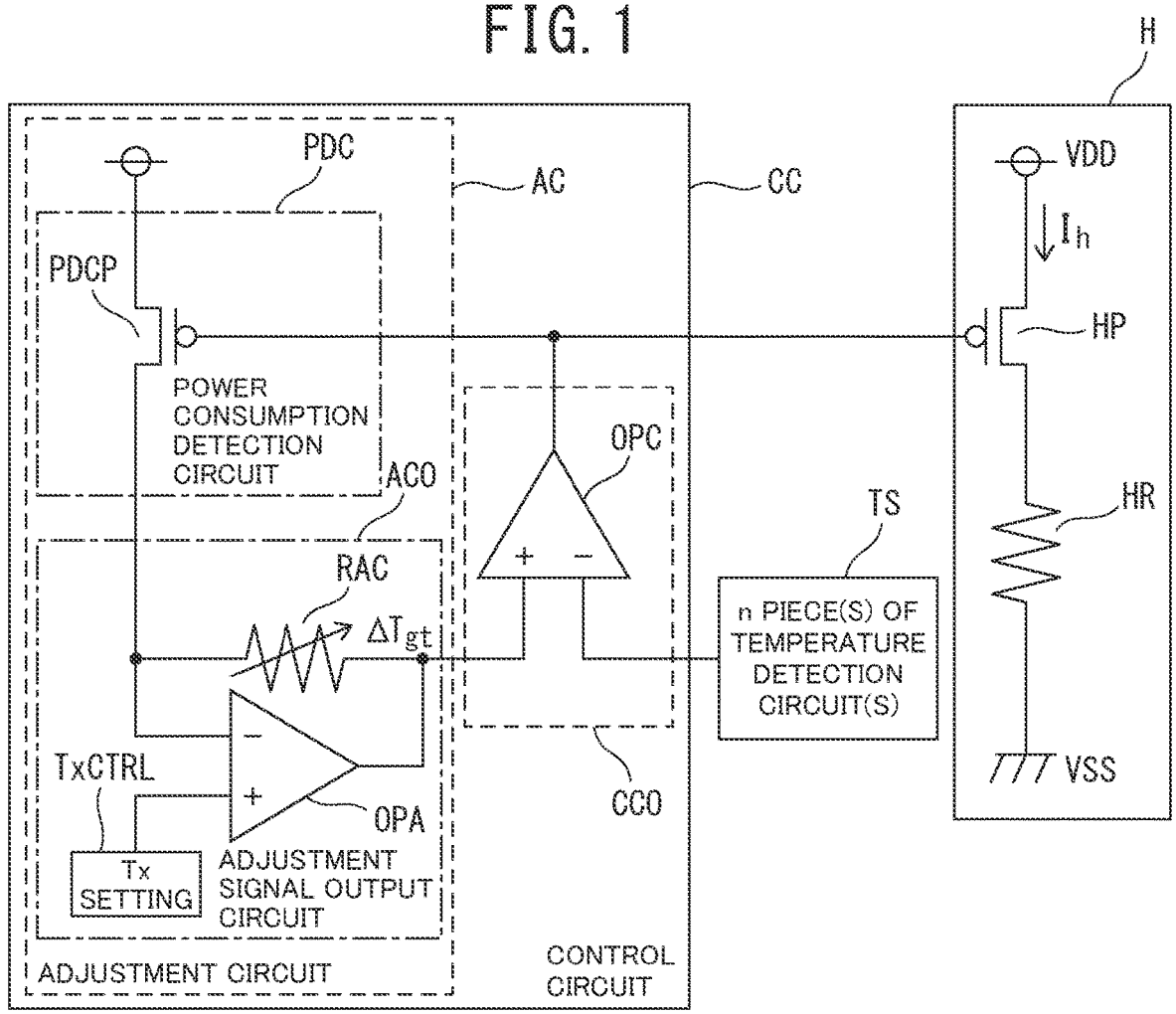
FIG. 1 is a circuit diagram illustrating an example of a conventional oscillation control circuit.

Next, referring to the drawings, an embodiment of the present invention will be described. In the description of the drawings, same or similar elements are denoted by the same or similar reference signs. The drawings are schematic. The embodiments to be described below are intended to exemplify a device and a method for embodying the technical idea of the present invention, and the technical idea of the present invention does not limit arrangements of components and the like to those described below. Various modifications may be made to the technical idea of the present invention within the technical scope defined by the claims.

<Factor that Causes Nth-Order Error Component to Remain>

First, a description will be given of a factor that causes an Nth-order error component to remain in the above-described conventional first-order correction method.

JP5977197B describes a temperature control circuit that performs temperature control by shifting a target temperature of an integrated circuit IC by a first-order correction component. As illustrated in FIG. 1, the temperature control circuit controls a heater current amount Ih according to a temperature of an ambient temperature Ta by thermal feedback from a temperature sensor (temperature detection circuit) TS, an amplifier OPC, a heater current source HP, and a heater resistor HR. For example, if the ambient temperature Ta is a high temperature, the temperature of the integrated circuit IC is also relatively high due to influence of the ambient temperature Ta, so that the amount of heat generated by a heater can be made small, consequently reducing heater current. In other words, a current value of a replica current source PDCP for detecting a current value flowing through the heater current source HP is proportional to a temperature difference Tgt−Ta between the integrated circuit IC and an outside air. A "target temperature shift amount ΔTgt" that is obtained by applying the replica current value Tgt−Ta to a resistor RAC is proportional to the temperature difference Tgt−Ta between the integrated circuit IC and the outside air. This provides a function that allows the target temperature to be shifted in first order in response to a change in the ambient temperature Ta.

Here, the heater current source HP and the replica current source PDCP form a mirror circuit in which PMOS elements are mirror-connected to each other, and whose mirror ratio is significantly large, which is a factor that causes a nonlinear component (Nth-order component) to be added to control of the target temperature.

In other words, as a typical example of the current value, the current value of the heater current source HP is of the order of several hundred [mA] to raise the IC temperature. Additionally, the current value of the replica current source PDCP is, for example, of the order of several ten [μA] to prevent unnecessary thermal offset. Due to that, a typical example of the current mirror ratio between the heater current source HP and the replica current source PDCP is "several hundred [mA]/several ten [μA]=several tens of thousands", which is significantly large. The significantly large mirror ratio value causes current mirror nonlinearity.

Here, the mirror ratio is determined by a size parameter ratio of W/L in the MOS transistors of a mirror source and a mirror destination. Here, W represents a channel width, and L represents a channel length.

If the mirror ratio is intended to be set to, for example, "10,000", it is unrealistic to achieve the ratio of "10,000" only by the value of W. Therefore, as in an example of FIG. 2, the channel length L is increased on the mirror destination side.

However, due to the different values of L, a difference is made between gate voltage thresholds Vth of the PMOS elements of the mirror source and the mirror destination.

Here, when the size and voltage threshold of the mirror source MOS element are defined as W1/L1 and Vth1, the size and voltage threshold of the mirror destination MOS element are defined as W2/L2 and Vth2, gate-source voltages of both MOS elements are defined as Vgs, and the current mirror ratio is defined as M, the following equation (2) holds:

$$M=\{(W2/L2)/(W1/L1)\}\times\{(Vgs-Vth2)/(Vgs-Vth1)\}2 \quad (2)$$

Figure 2:
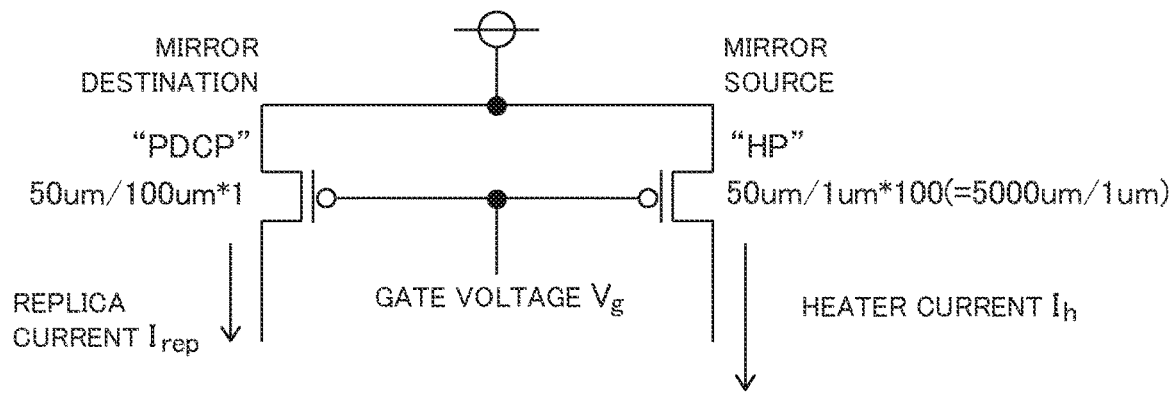
FIG. 2 is an illustrative diagram used to illustrate operation of the conventional oscillation control circuit.

If Vth1=Vth2, the mirror ratio becomes the ratio of W/L. However, as illustrated in FIG. 2, since the channel length is different between the mirror source and the mirror destination, the voltage threshold is Vth1≠Vth2, so that the mirror ratio M depends on Vgs. In other words, the mirror ratio M depends on the heater current Ih.

Figure 3A:
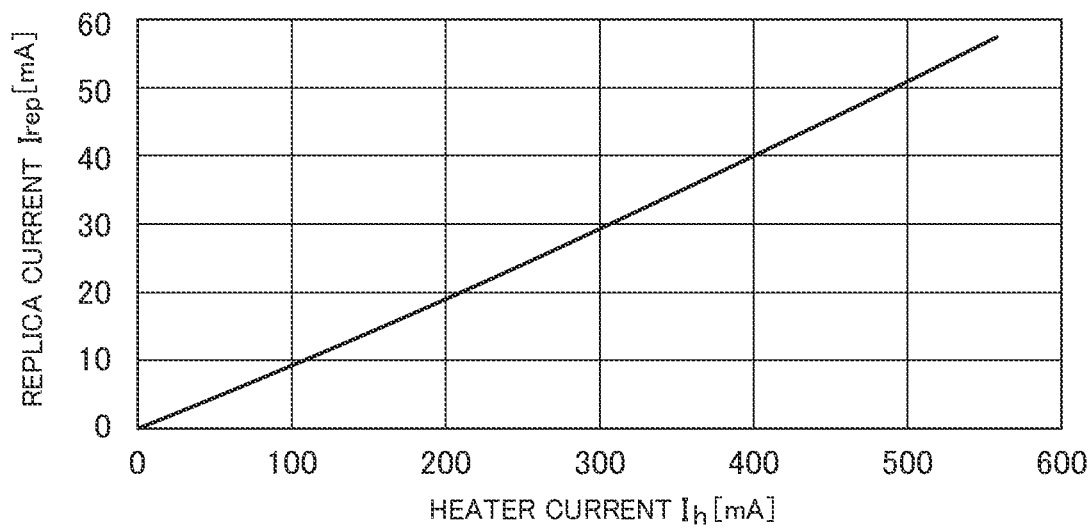
FIGS. 3A and 3B are characteristic diagrams illustrating characteristics of the conventional oscillation control circuit.
Figure 3B:
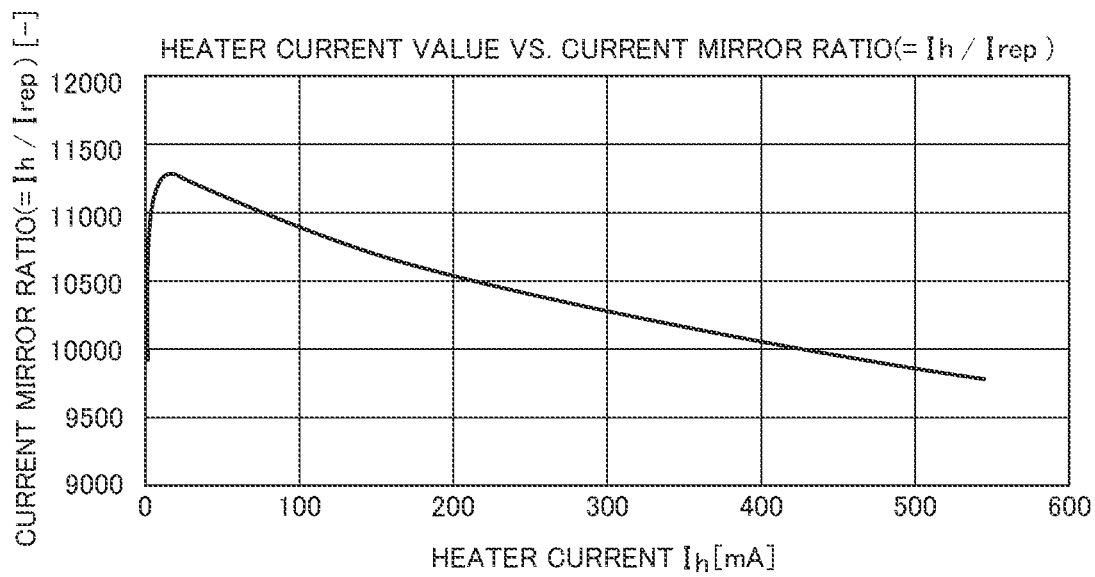

FIGS. 3A and 3B illustrate simulation results of the current value and the current mirror ratio when the mirror circuit illustrated in FIG. 2 has a power supply voltage of 3.3 [V] and a PMOS drain voltage of 0 [V]. FIG. 3A illustrates a relationship between the heater current value (Ih) and a replica current value (Irep). FIG. 3B illustrates a relationship between the heater current value (Ih) and a current mirror ratio (Ih/Irep).

As illustrated in FIG. 3B, the current mirror ratio is not a fixed value of 10, 000, and fluctuates nonlinearly with respect to the heater current value.

Figure 4:
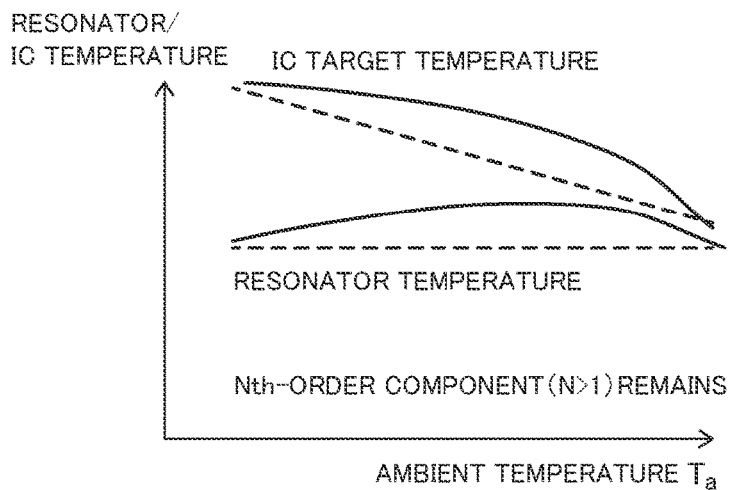
FIG. 4 is a characteristic diagram used to illustrate the operation of the conventional oscillation control circuit.

When trying to correct the target temperature of the IC in first order by using the replica current, the mirror ratio fluctuates, which causes an unnecessary nonlinear component (Nth-order component (N is an integer>1)) to be added to the target temperature, as illustrated in FIG. 4. Due to that, the Nth-order component also remains in the resonator. In other words, the Nth-order error component needs to be reduced. Note that, in FIG. 4, the horizontal axis represents the ambient temperature Ta, and the vertical axis represents a resonator temperature or the target temperature of the integrated circuit IC.

Then, the Nth-order component can be removed by correcting the target temperature not in first order but in Nth order (N is an integer>1).

First Embodiment

First, a first embodiment of the present invention will be described.

According to the first embodiment, in an oscillation control circuit configured to suppress oscillation frequency fluctuation due to temperature fluctuation, an Nth-order component is removed by correcting a target temperature not in first order but in Nth-order (N is an integer>1).

Figure 5:
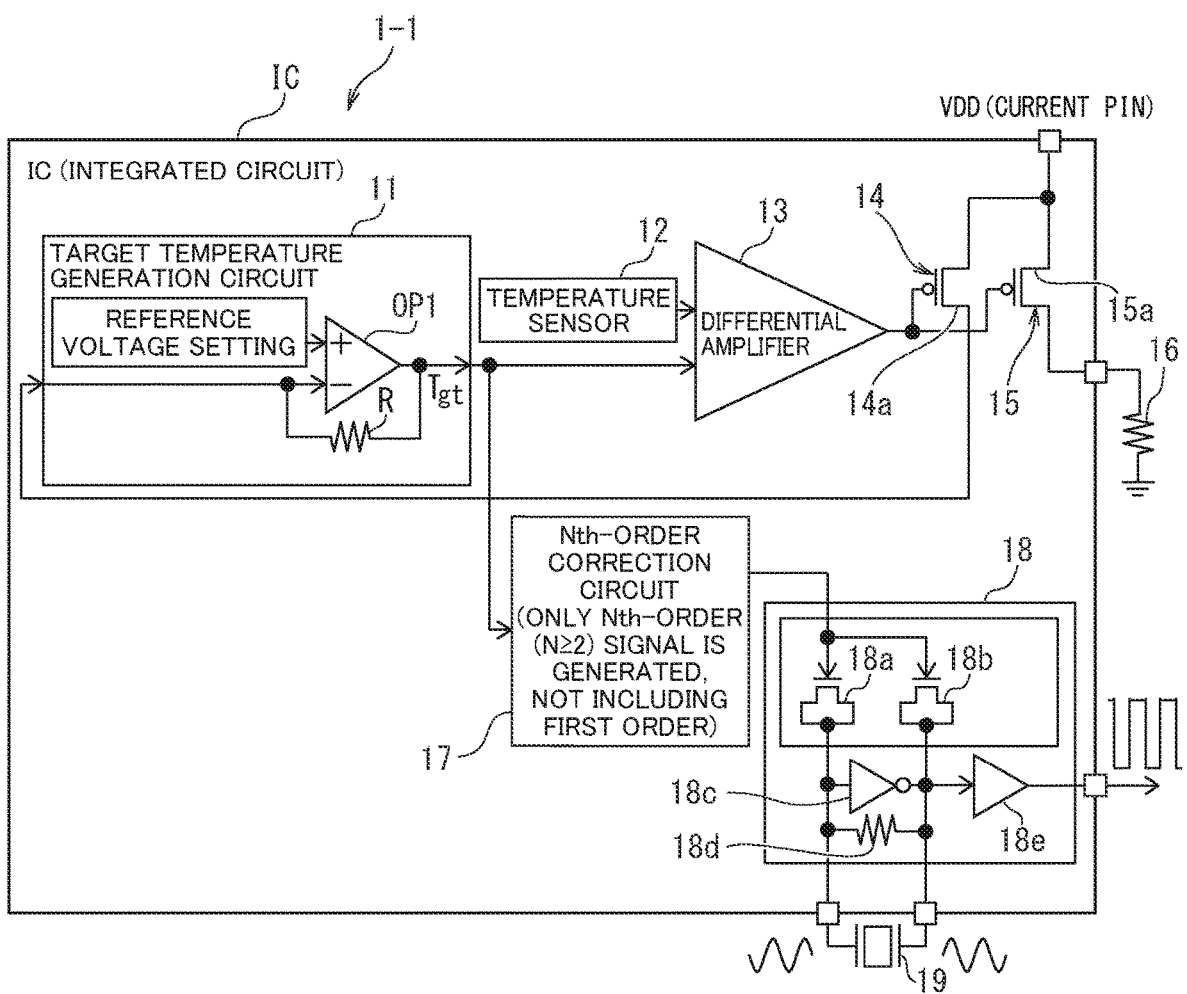
FIG. 5 is a block diagram illustrating an example of an oscillation control circuit according to a first embodiment of the present invention.

FIG. 5 is a block diagram illustrating an example of an oscillation control circuit 1-1 according to the first embodiment of the present invention. As illustrated in FIG. 5, the oscillation control circuit 1-1 includes a target temperature generation circuit 11, a temperature sensor 12, an differential amplifier 13, a heater current detection circuit 14 serving as a driving amount detection circuit, a heater current driver 15, a heater resistor (a heater serving as a heat generation circuit) 16, an Nth-order correction circuit 17, an oscillation circuit 18, and a resonator 19 that is a target object to be subjected to temperature control. The oscillation circuit 18 and the resonator 19 form a voltage-controlled crystal oscillator (VCXO). The target temperature generation circuit 11, the temperature sensor 12, the differential amplifier 13, the heater current detection circuit 14, the heater current driver 15, the Nth-order correction circuit 17, and the oscillation circuit 18 are included in an integrated circuit IC. Then, the integrated circuit IC, the heater resistor (heater) 16, and the resonator 19 are stored in a package (unillustrated) to form a module. The differential amplifier 13 and the heater current driver 15 correspond to a drive circuit, and the Nth-order correction circuit 17 corresponds to a cancellation circuit.

The target temperature generation circuit 11 includes an operational amplifier OP1, and a positive input of the operational amplifier OP1 receives a reference voltage that is a constant voltage equivalent to an intended temperature of the resonator 19. Additionally, a negative input of the operational amplifier OP1 receives an output (a driving amount detection value) of the heater current detection circuit 14, and also receives an output of the operational amplifier OP1 via a resistor R, whereby a signal is output that is equivalent to an amount of heat generation necessary to heat an ambient temperature of the resonator 19.

The temperature sensor 12 measures a temperature inside the package, and outputs a detection signal to the differential amplifier 13. The detection signal of the temperature sensor 12 is input to one input terminal of the differential amplifier 13, and the output signal of the target temperature generation circuit 11 is input to the other input terminal thereof. The differential amplifier 13 calculates a difference between the output signal of the target temperature generation circuit 11 and the detection signal of the temperature sensor 12, and outputs a difference value to the heater current detection circuit 14 and the heater current driver 15.

The heater current detection circuit 14 includes a PMOS element 14a. A source of the PMOS element 14a is connected to a power supply VDD, and a drain thereof is connected to the negative input of the operational amplifier OP1. A gate of the PMOS element 14a receives the output of the differential amplifier 13.

The heater current driver 15 includes a PMOS element 15a connected between the power supply VDD and a ground potential, and the heater resistor, i.e., the heater 16 is connected between a drain of the PMOS element 15a and a ground potential. A gate of the PMOS element 15a receives the output of the differential amplifier 13. The PMOS element 14a of the heater current detection circuit 14 and the PMOS element 15a of the heater current driver 15 form a mirror circuit.

Figure 6:
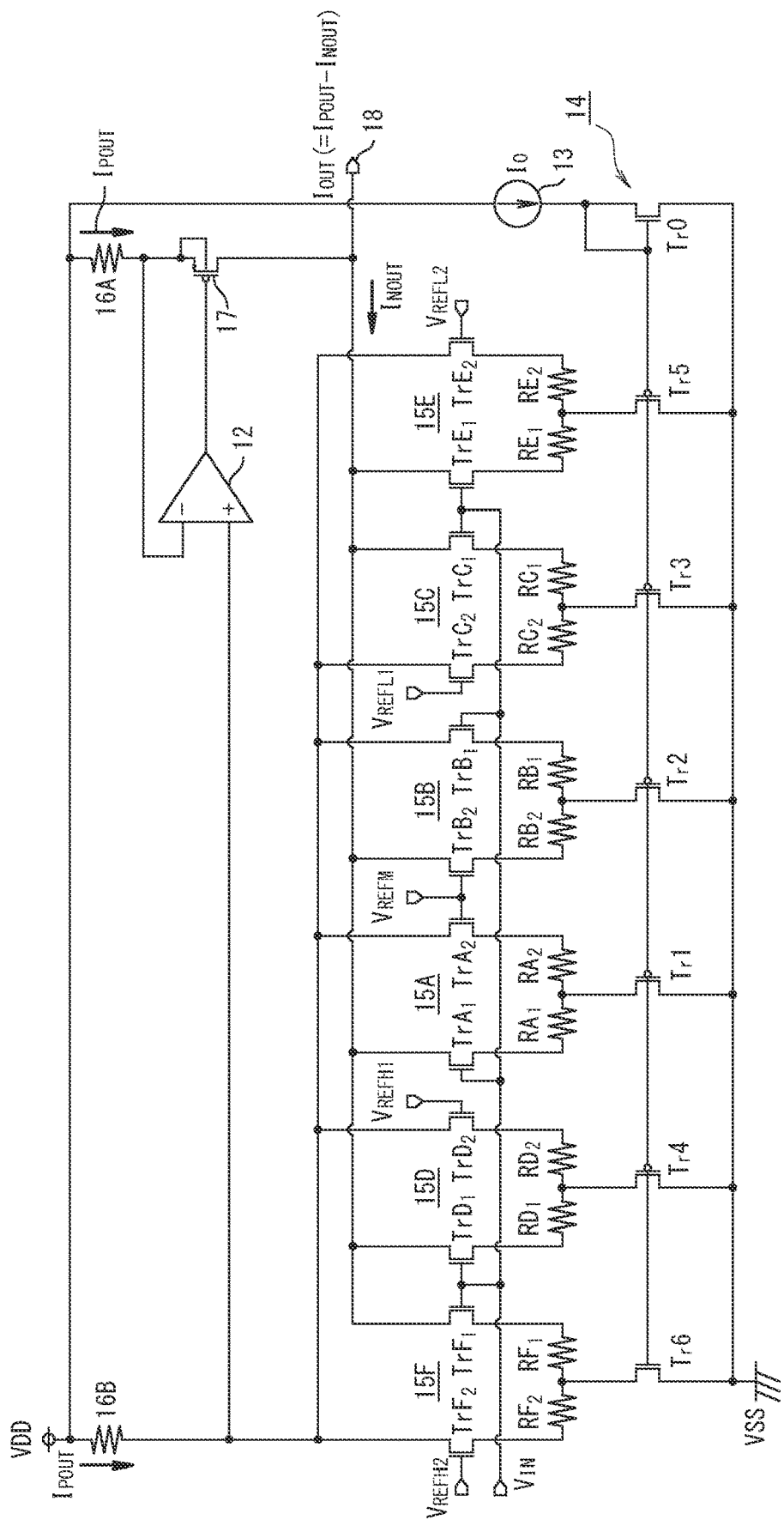
FIG. 6 is a circuit diagram illustrating an example of an Nth-order correction circuit.

The Nth-order correction circuit 17 receives the output of the operational amplifier OP1 of the target temperature generation circuit 11, generates a second or higher Nth-order (N is an integer>1) output signal from the input signal, and outputs the generated signal as a correction signal to the oscillation circuit 18. For example, an Nth-order component generation circuit illustrated in FIG. 6, which is described in U.S. Pat. No. 7,154,351 B, is applicable to the Nth-order correction circuit 17. The Nth-order correction circuit 17 is not limited to the Nth-order component generation circuit illustrated in FIG. 6, and even other known Nth-order component generation circuits are applicable.

The oscillation circuit 18 includes variable capacitance transistors 18a and 18b each formed by an NMOS element whose source and drain are short-circuited, an amplifier 18c configured to output an inverted signal and a resistor 18d, both of which are connected between a source/drain terminal of the variable capacitance transistor 18a and a source/drain terminal of the variable capacitance transistor 18b, and an amplifier 18e connected to the source/drain terminal of the variable capacitance transistor 18b. Between the variable capacitance transistors 18a and 18b, the resonator 19 is also connected in parallel to the resistor 18d.

Gates of the variable capacitance transistors 18a and 18b receive the correction signal output from the Nth-order correction circuit 17, and capacitance values of the variable capacitance transistors 18a and 18b are adjusted according to the correction signal. As a result, an output frequency of the resonator 19 is adjusted and output as an oscillation signal. The resonator 19 can be a quartz crystal resonator, an MEMS resonator, or another type of resonator.

In the oscillation control circuit 1-1 having such a structure, a difference between a target temperature Tgt set by the target temperature generation circuit 11 and an in-package temperature detected by the temperature sensor 12 is detected by the differential amplifier 13, and the heater current driver 15 is driven so that the target temperature Tgt coincides with the in-package temperature. A heater current at this time is detected by the heater current detection circuit 14, and input to the target temperature generation circuit 11. On the other hand, the Nth-order correction circuit 17 receives the target temperature Tgt, and generates an Nth-order (N is an integer>1) correction signal. In response to the Nth-order correction signal, the oscillation circuit 18 controls the resonator 19, whereby a frequency of the resonator 19 is controlled to a frequency reflecting the Nth-order correction signal.

The thermal feedback loop of the oscillation control circuit 1-1 allows the heater current amount to be controlled so that the detection temperature of the temperature sensor 12 coincides with the target temperature Tgt. In other words, the heater current amount converges to an amount proportional to an amount of temperature rise in the package, i.e., to the difference between the target temperature Tgt and the ambient temperature Ta. Thus, the output of the heater current detection circuit 14 that is a mirror current source of the heater current driver also has a first-order dependency on the ambient temperature Ta and can be used as an electrical signal representing the status of the ambient temperature Ta.

Here, even though the control by the thermal feedback loop is performed, the temperature of the resonator 19 does not completely coincide with the target temperature Tgt, as shown in the above-described expression (1), and fluctuates with the first-order dependency on the ambient temperature Ta. Thus, to offset the first-order temperature fluctuation in the resonator 19, the present circuit structure causes the target temperature Tgt to fluctuate in first order with respect to the ambient temperature Ta so that the temperature of the resonator 19 is maintained constant. As a means of doing so, the target temperature Tgt is caused to fluctuate so as to have the first-order dependency on the output of the heater current detection circuit 14. In other words, the target temperature is an intended temperature of the resonator 19 that is the target object added with a temperature deviation that occurs due to a misalignment between an arrangement position of the resonator 19 that is the target object and a position of the temperature sensor 12.

Additionally, at this time, the Nth-order correction circuit 17 receives the output signal of the target temperature generation circuit 11 and generates an Nth-order correction signal to adjust the variable capacitances of the oscillation circuit 18 according to the correction signal. Accordingly, the variable capacitances of the oscillation circuit 18 are adjusted so as to cancel a frequency fluctuation due to a nonlinear component contained in the heater current detection output, so that the oscillation frequency of the resonator 19 is corrected by an Nth-order (N is an integer>1) correction signal. As a result, the ambient temperature of the resonator 19 is adjusted by adjusting the heater current by the output signal of the target temperature generation circuit 11, thereby enabling suppression of the frequency fluctuation due to temperature fluctuation. Furthermore, even when a nonlinear component is added to the heater current detection circuit 14 that forms the mirror circuit for detecting heater current, the frequency of the resonator 19 is corrected by an Nth-order correction signal, thereby enabling suppression of influence due to the nonlinear component on oscillation frequency fluctuation. As a result, oscillation frequency fluctuation caused by temperature fluctuation can be further suppressed, and more highly accurate control can be performed so that the oscillation frequency of the resonator 19 becomes an intended frequency.

Additionally, the Nth-order correction circuit 17 adjusts the variable capacitances of the oscillation circuit 18, but does not adjust the thermal control system loop including the target temperature generation circuit 11, the differential amplifier 13, the heater current driver 15, and the heater current detection circuit 14. Thus, adjustment can be made without rather losing stability of the thermal control system due to adjustment of the thermal control system loop by the Nth-order correction circuit 17.

Second Embodiment

Next, a second embodiment of the present invention will be described.

The second embodiment is a temperature control circuit configured to control the temperature of the integrated circuit IC at a constant level, in which the Nth-order correction circuit 17 corrects the detection signal of the temperature sensor 12 so that the temperature of the integrated circuit IC, i.e., the in-package temperature is caused to coincide with higher accuracy with an intended temperature.

Figure 7:
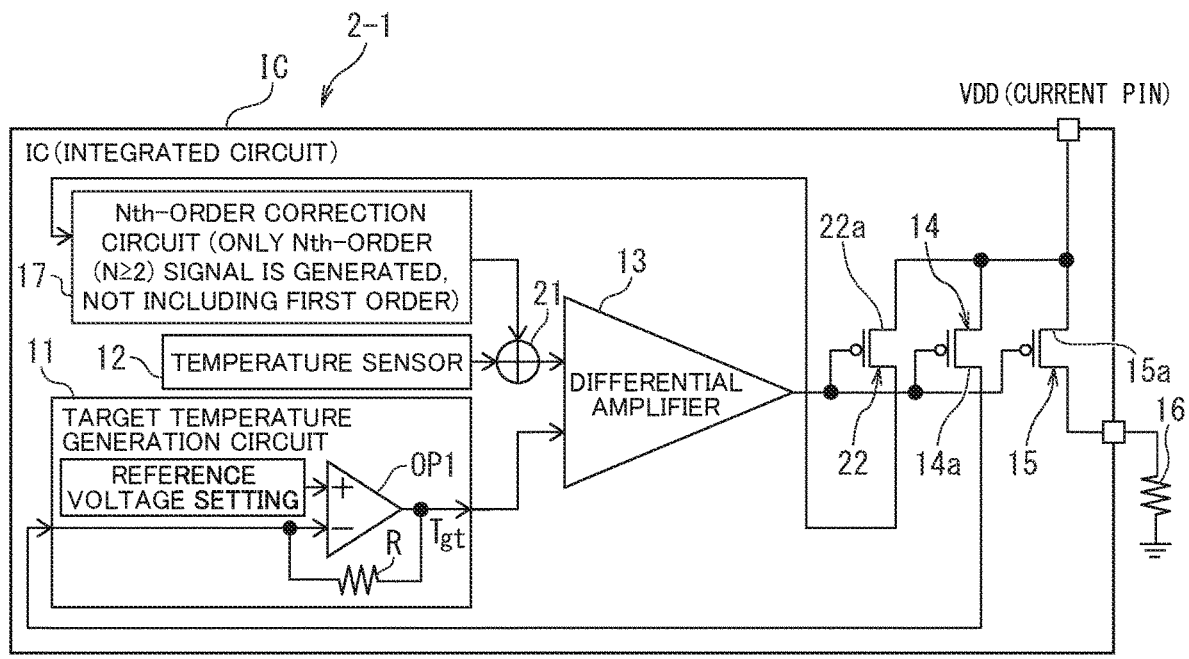
FIG. 7 is a block diagram illustrating an example of a temperature control circuit according to a second embodiment of the invention.

FIG. 7 is a block diagram illustrating an example of a temperature control circuit 2-1 according to the second embodiment. Note that the oscillation control circuit 1-1 according to the first embodiment illustrated in FIG. 5 performs temperature control to cause the oscillation frequency to be coincident with an intended value, in which temperature control processing includes the same processing as temperature control processing by the temperature control circuit 2-1. Therefore, in the temperature control circuit 2-1 of FIG. 7, the same portions as those of the oscillation control circuit 1-1 are denoted by the same reference signs, and detailed descriptions thereof will be omitted.

As illustrated in FIG. 7, in the temperature control circuit 2-1, the output of the Nth-order correction circuit 17 is added to the detection signal of the temperature sensor 12.

Specifically, the temperature control circuit 2-1 includes the target temperature generation circuit 11, the temperature sensor 12, the differential amplifier 13, the heater current detection circuit 14, the heater current driver 15, the heater resistor (heater) 16, and the Nth-order correction circuit (N>1) 17, and further includes an adder 21 and a heater current detection circuit 22. The target temperature generation circuit 11, the temperature sensor 12, the differential amplifier 13, the heater current detection circuit 14, the heater current driver 15, the Nth-order correction circuit 17, the adder 21, and the heater current detection circuit 22 are included in an integrated circuit IC. The integrated circuit IC and the heater resistor (heater) 16 are stored in a package (unillustrated) to form a module.

The adder 21 adds together the output signal of the Nth-order correction circuit 17 and the detection signal of the temperature sensor 12.

The heater current detection circuit 22 includes a PMOS element 22a whose source is connected to the power supply VDD, whose drain is connected to an input terminal of the Nth-order correction circuit 17, and whose gate receives an output of the differential amplifier 13. The output of the differential amplifier 13 is input not only to the PMOS element 22a but also to the PMOS element 14a of the heater current detection circuit 14 and the PMOS element 15a of the heater current driver 15, and the heater current detection circuit 22, the heater current detection circuit 14, and the heater current driver 15 form a mirror circuit.

In the temperature control circuit 2-1 thus formed, the Nth-order correction circuit 17 receives a heater current detected by the heater current detection circuit 22 and generates an Nth-order (N is an integer>1) correction signal. The generated correction signal is added to the detection signal of the temperature sensor 12. Then, a difference signal between the detection signal of the temperature sensor 12 added with the correction signal and the output signal of the target temperature generation circuit 11 is calculated by the differential amplifier 13. On the basis of the difference signal, the heater current detection circuits 14 and 22 and the heater current driver 15 are controlled.

Thus, in the temperature control circuit 2-1 according to the second embodiment, the heater current detected by the heater current detection circuit 22 is input to form an Nth-order correction signal, and then the correction signal is added to the detection signal of the temperature sensor 12 by the adder 21. Then, control is performed so that the detection signal of the temperature sensor 12 added with the correction signal coincides with the output signal of the target temperature generation circuit 11. As a result, frequency fluctuation due to temperature fluctuation can be suppressed, and also, even when a nonlinear component is added to the heater current detection circuits 14 and 22 forming the mirror circuit for detecting heater current, temperature control can be performed, including a temperature fluctuation due to the nonlinear component. Accordingly, temperature adjustment can be made with higher accuracy.

In the second embodiment, the Nth-order correction circuit 17 corresponds to a first Nth-order component generation circuit, the adder 21 corresponds to an addition circuit, and the Nth-order correction circuit 17 and the adder 21 correspond to a cancellation circuit.

Third Embodiment

Next, a third embodiment of the present invention will be described.

The third embodiment is different from the temperature control circuit 2-1 according to the second embodiment in that an Nth-order correction circuit 17a is included in place of the Nth-order correction circuit 17, and the adder 21 and the heater current detection circuit 22 are not included.

Figure 8:
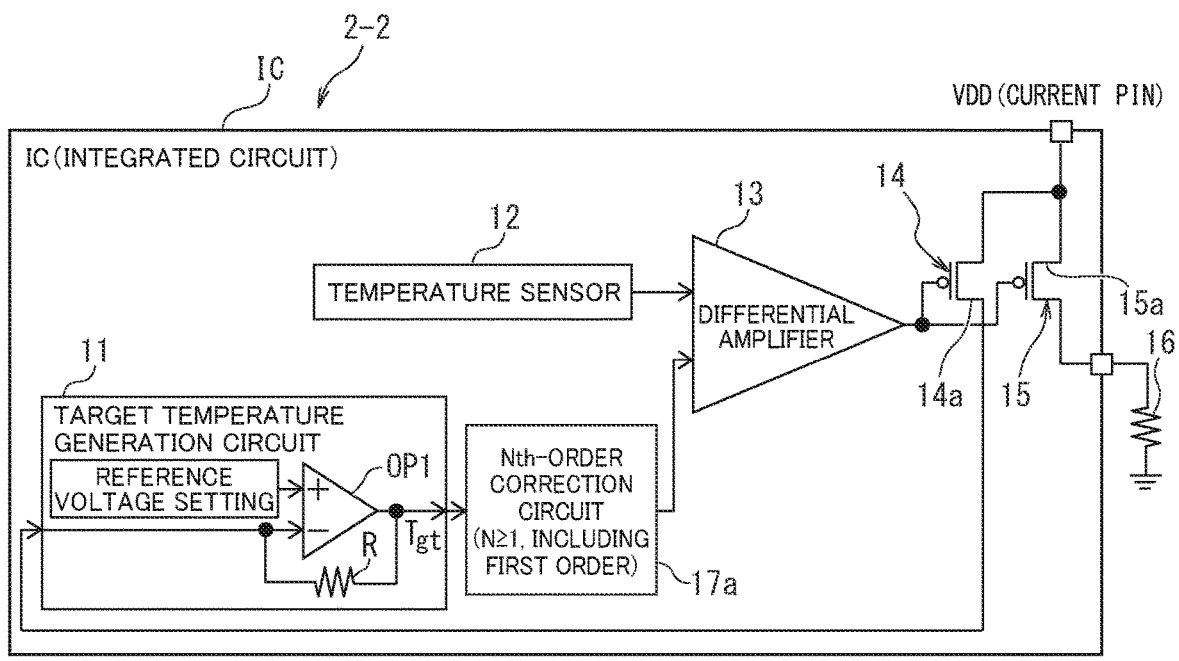
FIG. 8 is a block diagram illustrating an example of a temperature control circuit according to a third embodiment of the invention.

Specifically, as illustrated in FIG. 8, a temperature control circuit 2-2 includes the Nth-order correction circuit 17a between the target temperature generation circuit 11 and the differential amplifier 13. The Nth-order correction circuit 17a receives the output signal of the target temperature generation circuit 11, generates a first or higher Nth-order (N≥1) output signal, and outputs the signal as a correction signal.

The differential amplifier 13 controls the heater current so that a difference between the detection signal of the temperature sensor 12 and the Nth-order (N is an integer≥1) correction signal output from the Nth-order correction circuit 17a becomes zero.

Accordingly, even in this case, there can be obtained functions and effects equivalent to those of the second embodiment.

In the third embodiment, the Nth-order correction circuit 17a corresponds to a second Nth-order component generation circuit and the cancellation circuit.

Fourth Embodiment

Next, a fourth embodiment of the present invention will be described.

The fourth embodiment is different from the temperature control circuit 2-2 according to the third embodiment in that the arrangement position of the Nth-order correction circuit 17a is changed, and a target temperature generation circuit 11a is included in place of the target temperature generation circuit 11.

Figure 9:
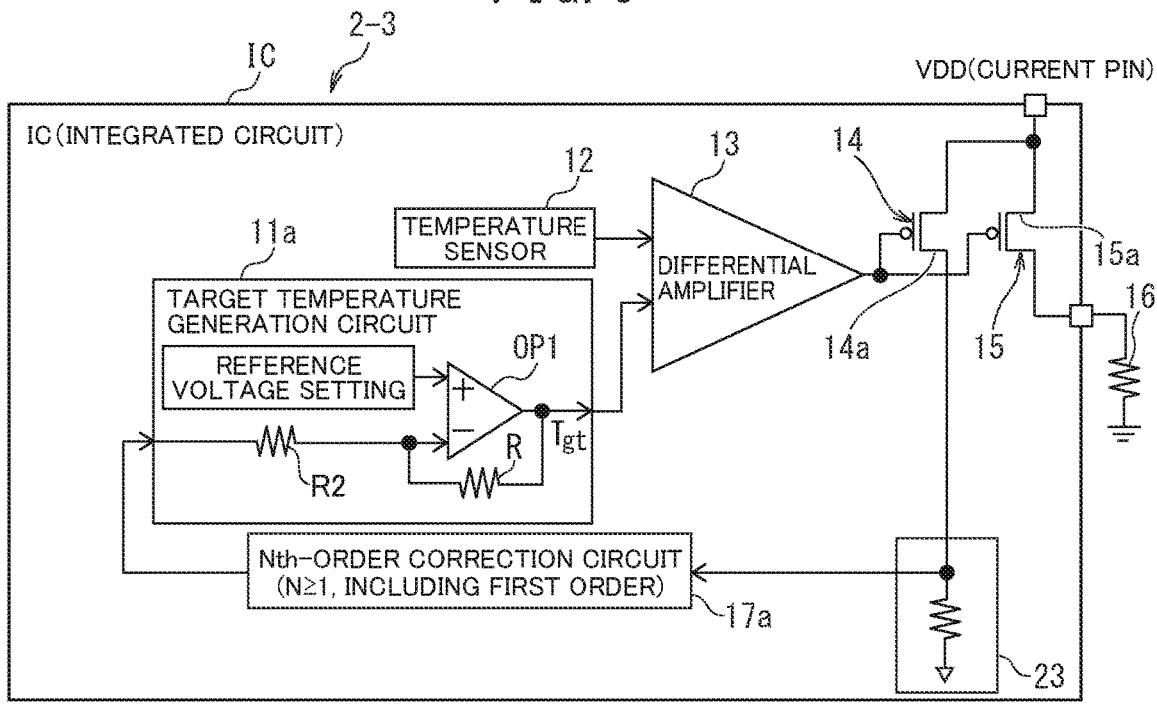
FIG. 9 is a block diagram illustrating an example of a temperature control circuit according to a fourth embodiment of the invention.

In a temperature control circuit 2-3 illustrated in FIG. 9, a current-to-voltage conversion circuit 23 is provided on an output side of the heater current detection circuit 14, i.e., on a drain side of the PMOS element 14a. The heater current output from the heater current detection circuit 14 is converted to a voltage signal by the current-to-voltage conversion circuit 23. The voltage conversion signal is input to the Nth-order correction signal 17a, and the output of the Nth-order correction circuit 17a is input to the target temperature generation circuit 11a.

The Nth-order correction circuit 17a outputs a first or higher Nth-order (N≥1) correction signal converted to a value equivalent to the voltage of the heater current. The operational amplifier OP1 of the target temperature generation circuit 11a receives the Nth-order correction signal via a resistor R2. In other words, the output signal of the target temperature generation circuit 11a and the Nth-order correction signal of the Nth-order correction circuit 17a are input to the negative input of the operational amplifier OP1.

The differential amplifier 13 controls the heater current so that a difference between the output signal of the target temperature generation circuit 11a and the detection signal of the temperature sensor 12 becomes zero. Accordingly, even in this case, there can be obtained functions and effects equivalent to those of the third embodiment.

In the above fourth embodiment, the Nth-order correction circuit 17a corresponds to the second Nth-order component generation circuit and the cancellation circuit.

Note that, the temperature control circuits 2-1 to 2-3 according to the second to fourth embodiments can control with higher accuracy so that an ambient temperature of the integrated circuit IC detected by the temperature sensor 12 coincides with an intended temperature. Thus, applying each of the temperature control circuits 2-1 to 2-3 to an optional circuit requiring temperature control, such as an oscillation control circuit that controls the oscillation frequency of a resonator, for example, as in the oscillation control circuit 1-1 of the first embodiment enables the suppression of characteristic fluctuation in the optional circuit due to temperature fluctuation.

Fifth Embodiment

Next, a fifth embodiment of the present invention will be described.

The fifth embodiment is different from the oscillation control circuit 1-1 of the first embodiment illustrated in FIG. 5 in that, additionally, voltage fluctuation of the power supply VDD is considered.

Figure 10:
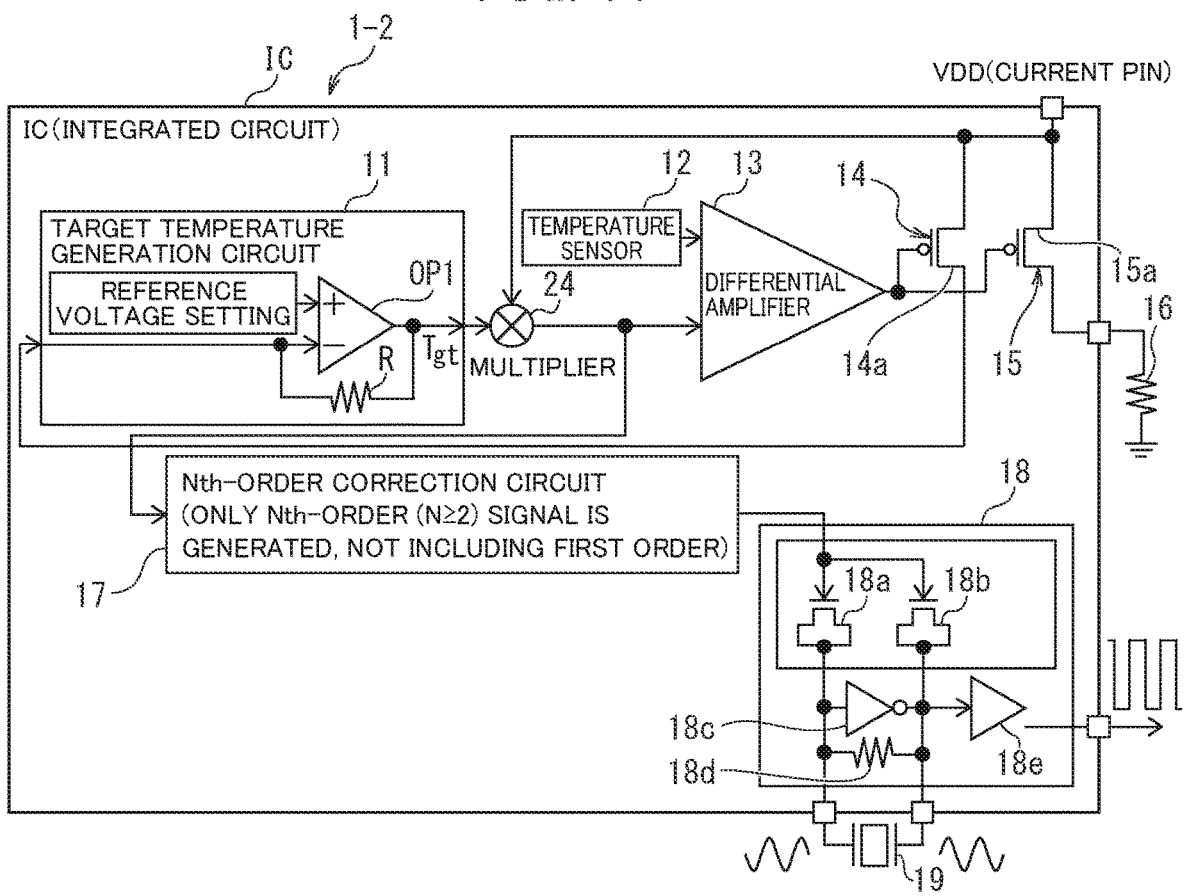
FIG. 10 is a block diagram illustrating an example of an oscillation control circuit according to a fifth embodiment of the invention.

As illustrated in FIG. 10, an oscillation control circuit 1-2 according to the fifth embodiment further includes a multiplier 24 between the target temperature generation circuit 11 and the differential amplifier 13 in the oscillation control circuit 1-1 according to the first embodiment. The multiplier 24 serving as a power supply fluctuation cancellation circuit multiplies the output signal of the target temperature generation circuit 11 by a voltage of the power supply VDD, inputs a multiplication result to the differential amplifier 13 and also to the Nth-order correction circuit 17.

In other words, when a thermal resistance of the package of the oscillation control circuit 1-2 as seen from the integrated circuit IC is θa [° C./W], the voltage of the power supply VDD is VDD [V] (hereinafter also referred to as power supply voltage VDD), and the heater current is Ih [A], the following equation (3) holds:

$$Ih=(Tgt-Ta)/(\theta a \times VDD) \qquad (3)$$

Equation (3) indicates that the heater current Ih is inversely proportional to the power supply VDD.

Here, in the Nth-order correction circuits 17 and 17a of the first to fourth embodiments, the Nth-order correction component of the target temperature Tgt is generated so as to be proportional to the heater current amount Ih.

Assume that an Nth-order correction component generated at a certain power supply voltage VDD has perfectly cancelled oscillation frequency temperature fluctuation.

Equation (3) indicates that when the power supply voltage VDD fluctuates in the above state, the heater current Ih fluctuates in inverse proportion to the power supply voltage VDD. As a result, the Nth-order correction component of the target temperature also fluctuates in inverse proportion to the power supply voltage VDD, resulting in oscillation frequency temperature fluctuation.

In other words, when the power supply voltage VDD drops, compensation by the Nth-order correction component becomes excessive, whereas when the power supply voltage VDD rises, compensation by the Nth-order correction component conversely becomes insufficient.

To avoid this, an Nth-order correction amount is made proportional to the power supply voltage VDD. In this manner, fluctuation in the Nth-order correction component that occurs associated with fluctuation of the power supply voltage VDD can be suppressed, so that correction by the Nth-order correction component can be made with higher accuracy. Thus, temperature control can be performed with higher accuracy, resulting in more highly accurate frequency control.

Figure 11:
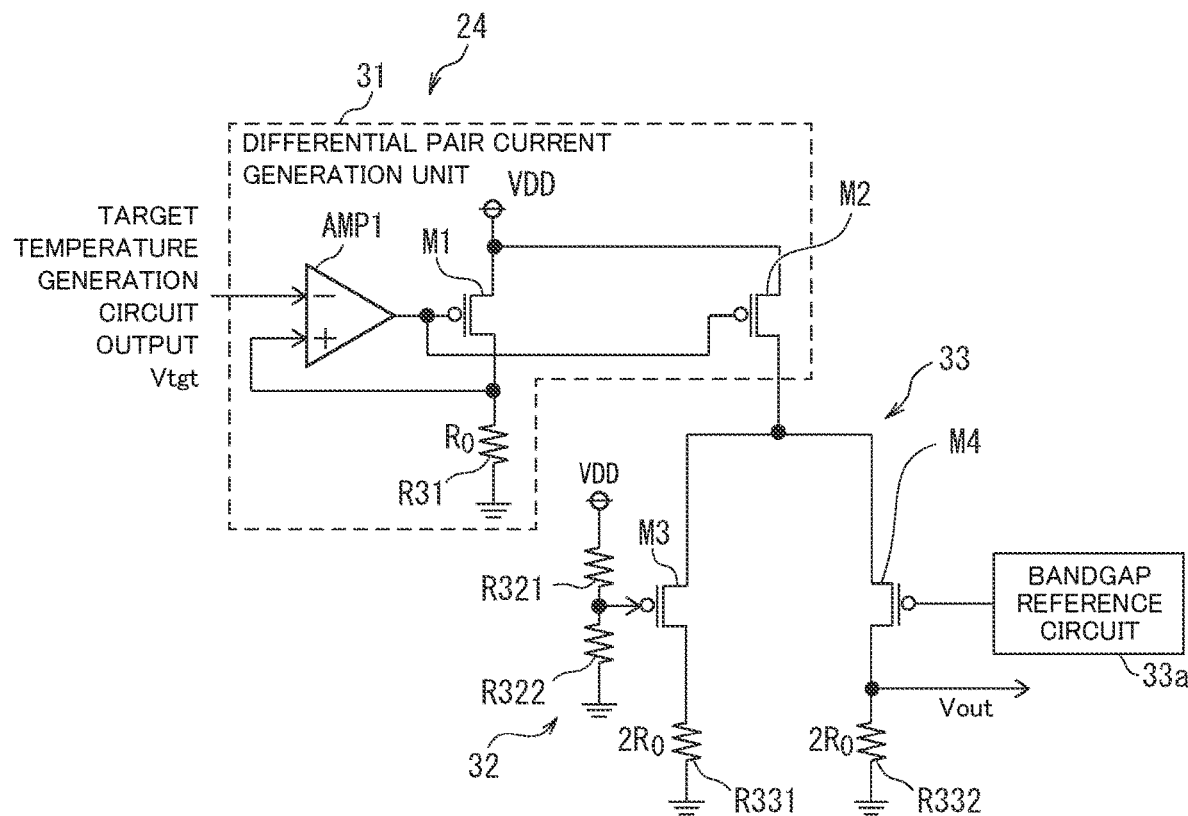
FIG. 11 is a circuit diagram illustrating an example of a multiplier formed by an analog circuit.

The multiplier 24 has, for example, a structure illustrated in FIG. 11.

The multiplier 24 includes a differential pair current generation unit 31, a power supply unit 32, and a PMOS receiving differential pair unit 33.

The differential pair current generation unit 31 includes a PMOS element M1 and a resistor R31 with a resistance value of R0 that are connected in series between the power supply voltage VDD and a ground potential, a PMOS element M2 that has a source connected to the power supply voltage VDD and that is mirror-connected with the PMOS element M1, and an amplifier AMP1. A negative input of the amplifier AMP1 receives an output Vtgt [V] of the target temperature generation circuit 11, and a positive input thereof receives a voltage at a connection point between the PMOS element M1 and the resistor R31. An output of the amplifier AMP1 is input to gates of the PMOS elements M1 and M2.

The power supply unit 32 includes a voltage divider circuit including resistors R321 and R322 connected in series between the power supply voltage VDD and a ground potential. The voltage divider circuit is configured to output, for example, 1.2 V when the power supply voltage is a typical VDD (a typical power supply voltage value under actual use conditions).

The PMOS receiving differential pair unit 33 includes a PMOS element M3, a resistor load R331 having one end connected to a drain of the PMOS element M3, a PMOS element M4, a resistor load R332 having one end connected to a drain of the PMOS element M4, and a bandgap reference circuit 33a. Sources of the PMOS elements M3 and M4 are connected to a drain of the PMOS element M2 of the differential pair current generation unit 31, and other ends of the resistor loads R331 and R332 are connected to ground potentials.

A gate of the PMOS element M3 receives an output of the voltage divider circuit included in the power supply unit 32. A gate of the PMOS element M4 receives an output of the bandgap reference circuit 33a, and a reference voltage of 1.2 V is applied regardless of the magnitude of the power supply voltage VDD.

Then, a drain voltage of the PMOS element M4 is output as a multiplier output voltage Vout.

In the multiplier 24 having such a structure, the differential pair current generation unit 31 generates a current of Itail=Vtgt/R0 to the PMOS receiving differential pair unit 33.

The output voltage Vout of the multiplier 24 is determined by a current flowing to the resistor load (one side 2R0) R332.

When the power supply voltage is a typical VDD, inputs to the gates of the PMOS elements M3 and M4 in the PMOS receiving differential pair unit 33 are both 1.2 V and balanced, as a result of which a current of Itail/2 (=Vtgt/(2R0)) flows through the resistor loads R331 and R332. That is, Vout=2R0×{Vtgt/(2R0)}=Vtgt.

On the other hand, when the power supply voltage VDD sufficiently increases, the output voltage Vout becomes 2 Vtgt, whereas when the power supply voltage VDD sufficiently drops, the output voltage Vout becomes 0 V.

Figure 12:
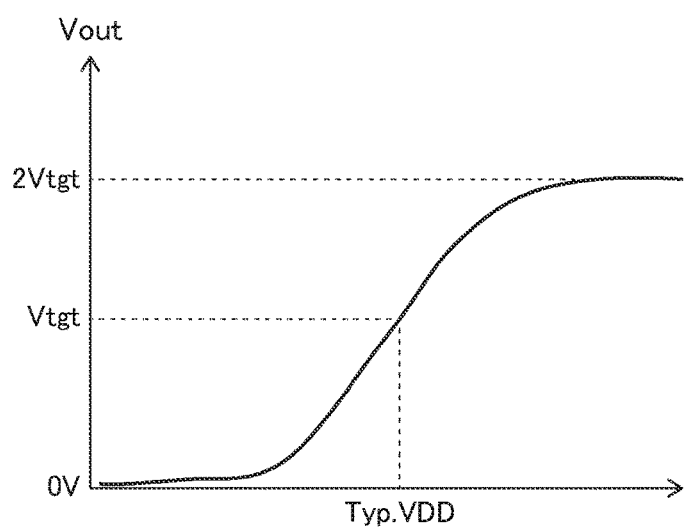
FIG. 12 is a characteristic diagram illustrating an example of characteristics of the multiplier of FIG. 11.

A characteristic graph obtained from the above operation can be illustrated as in FIG. 12, in which the horizontal axis represents the power supply voltage VDD and the vertical axis represents the output voltage Vout.

As illustrated in FIG. 12, the output voltage Vout of the multiplier 24 has linearity when the power supply voltage VDD is near the typical VDD, and has nonlinearity when the VDD is a voltage in a region somewhat larger or somewhat smaller than the typical VDD. Thus, in the region where the output characteristics have linearity, the multiplier 24 can be considered as a multiplier with the power supply voltage VDD.

Figure 13:
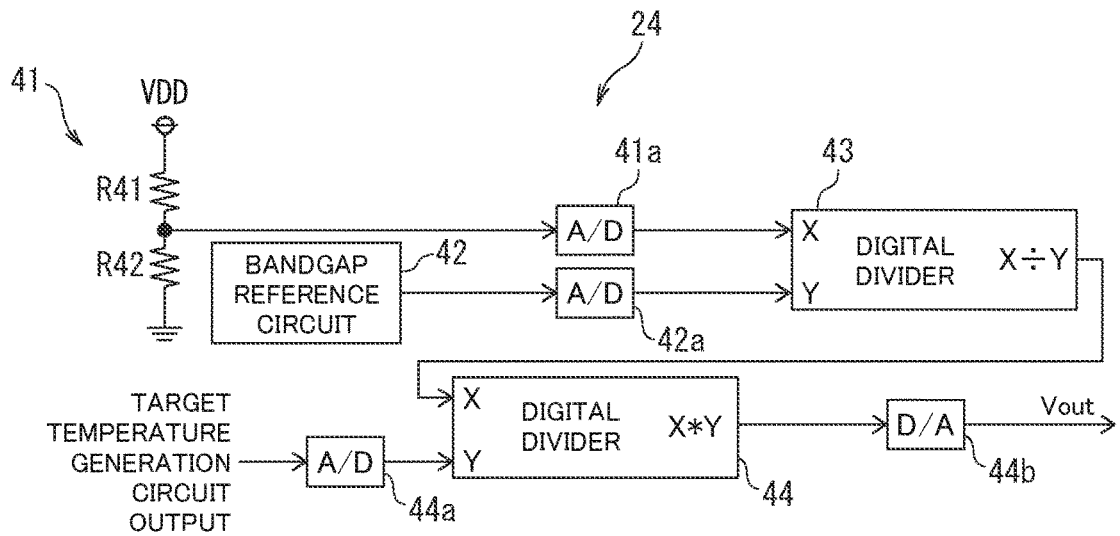
FIG. 13 is a block diagram illustrating an example of a multiplier formed by a digital circuit.

Next, FIG. 13 illustrates an example of the multiplier 24 that is formed by a digital circuit.

The multiplier 24 includes a power supply unit 41, a bandgap reference circuit 42, a digital divider 43, and a digital multiplier 44.

The power supply unit 41 includes resistors R41 and R42 connected in series between the power supply voltage VDD and a ground potential, thereby forming a voltage divider circuit. The voltage divider circuit outputs 1.2 V when the power supply voltage is a typical VDD.

The bandgap reference circuit 42 outputs a reference voltage of 1.2 V regardless of the magnitude of the power supply voltage VDD.

An output voltage of the power supply unit 41 is input as an "X input" of the digital divider 43 via an A/D converter 41a, and an output of the bandgap reference circuit 42 is input as a "Y input" of the digital divider 43 via an A/D converter 42b. The digital divider 43 outputs, as a divider output, "X÷Y" obtained by dividing the "X input" by the "Y input". The divider output of the digital divider 43 indicates a fluctuation ratio of the power supply voltage VDD to the typical VDD.

The digital multiplier 44 receives the divider output of the digital divider 43 as an "X input", and receives a digital signal obtained by converting the output of the target temperature generation circuit 11 by an A/D converter 44a as a "Y input". Then, the digital multiplier 44 multiplies the divider output by the output signal of the target temperature generation circuit 11 and outputs a multiplication result "X*Y". The multiplication result "X*Y" is converted to an analog signal by a D/A converter 44b and output as a multiplier output.

Sixth Embodiment

Next, a sixth embodiment of the present invention will be described.

The sixth embodiment is different from the temperature control circuit 2-2 according to the third embodiment illustrated in FIG. 8 in that, additionally, fluctuation of the power supply voltage VDD is considered.

Figure 14:
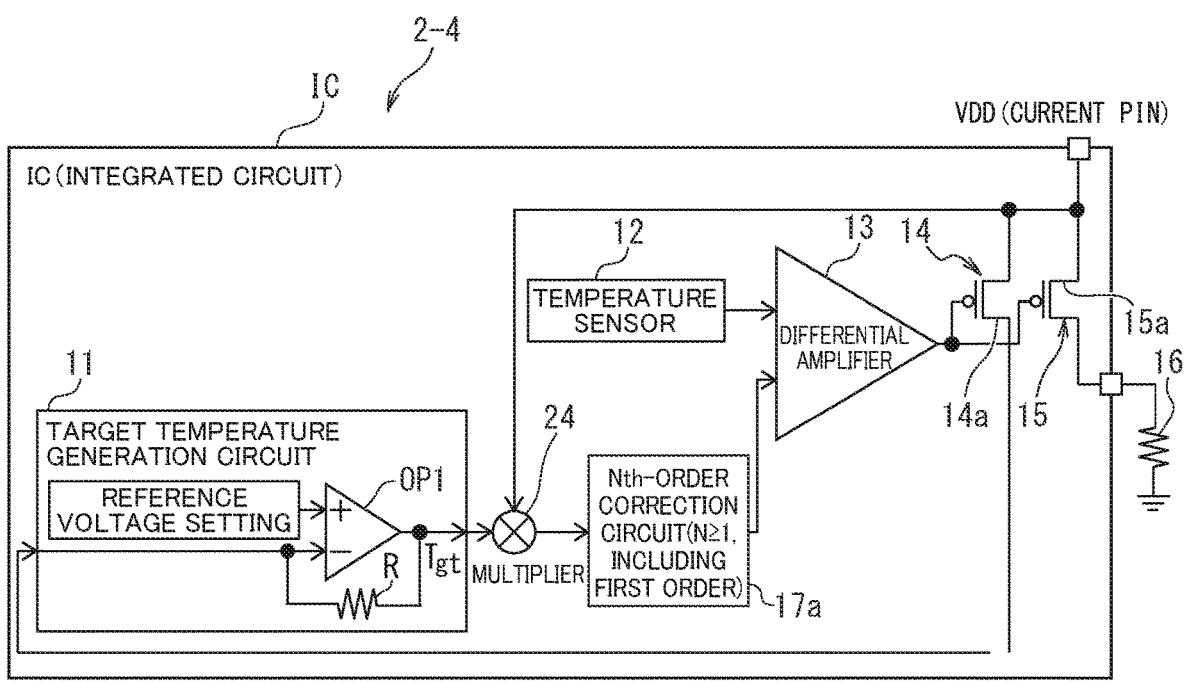
FIG. 14 is a block diagram illustrating an example of a temperature control circuit according to a sixth embodiment of the invention.

As illustrated in FIG. 14, a temperature control circuit 2-4 according to the sixth embodiment further includes a multiplier 24 between the target temperature generation circuit 11 and the Nth-order correction circuit (N≥1) 17a in the temperature control circuit 2-2 according to the third embodiment. The multiplier 24 serving as a power supply fluctuation cancellation circuit multiplies the output signal of the target temperature generation circuit 11 by the power supply voltage VDD, and inputs a multiplication result to the Nth-order correction circuit 17a.

The Nth-order correction circuit 17a receives the multiplication result between the output signal of the target temperature generation circuit 11 and the power supply voltage VDD, generates a first or higher Nth-order (N is an integer≥1) correction signal, and outputs the correction signal to the differential amplifier 13.

The differential amplifier 13 controls the heater current so that a multiplication value between the output signal of the target temperature generation circuit 11 and the power supply voltage VDD coincides with the detection signal of the temperature sensor 12. Accordingly, even in this case, there can be obtained functions and effects equivalent to those of the temperature control circuit 2-2 according to the third embodiment. Furthermore, since the heater current is controlled by additionally considering fluctuation of the power supply voltage VDD, influence of the fluctuation of the power supply voltage VDD on the temperature control is suppressed, so that the temperature control can be performed with higher accuracy.

Seventh Embodiment

Next, a seventh embodiment of the present invention will be described.

The seventh embodiment is different from the temperature control circuit 2-1 according to the second embodiment illustrated in FIG. 7 in that, additionally, fluctuation of the power supply voltage VDD is considered.

Figure 15:
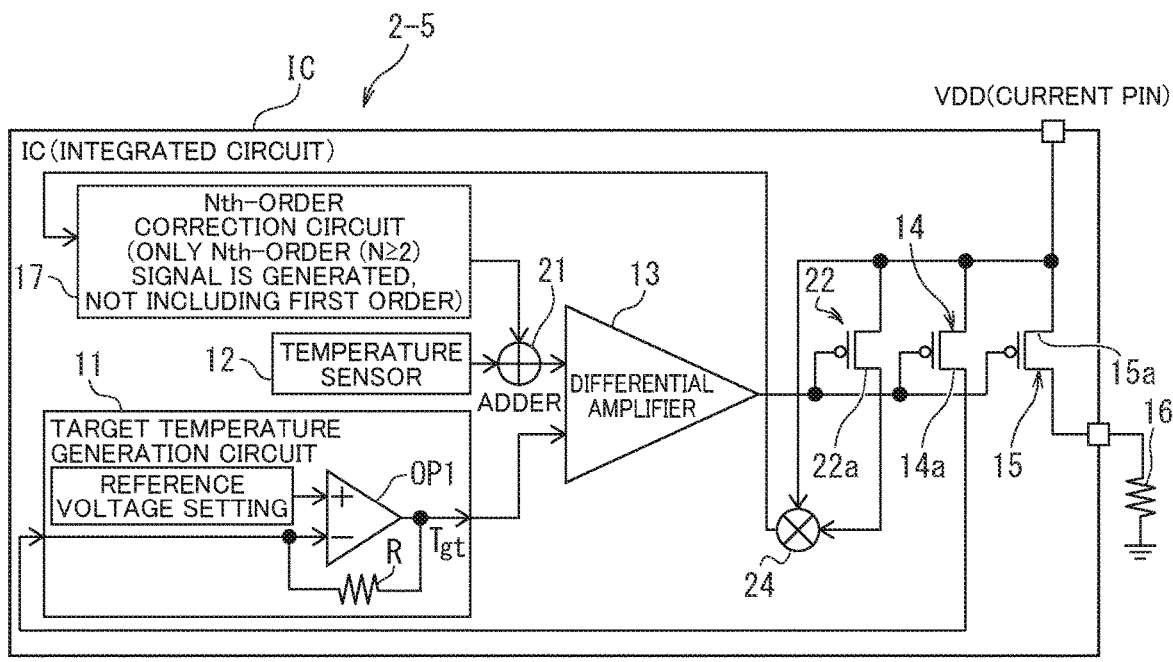
FIG. 15 is a block diagram illustrating an example of a temperature control circuit according to a seventh embodiment of the invention.

As illustrated in FIG. 15, a temperature control circuit 2-5 according to the seventh embodiment further includes the multiplier 24 between an output of the heater current detection circuit 22 and the Nth-order correction circuit 17 in the temperature control circuit 2-1 according to the second embodiment. The multiplier 24 serving as the power supply fluctuation cancellation circuit multiplies the output of the heater current detection circuit 22 by the power supply voltage VDD and inputs a multiplication result to the Nth-order correction circuit 17.

Then, the differential amplifier 13 controls the heater current so that a value obtained by adding an Nth-order (N is an integer>1) correction signal considering fluctuation of the power supply voltage VDD to the detection signal of the temperature sensor 12 coincides with the output signal of the target temperature generation circuit 11. Accordingly, even in this case, there can be obtained functions and effects equivalent to those of the temperature control circuit 2-1 according to the second embodiment. Furthermore, since the heater current is controlled by additionally considering fluctuation of the power supply voltage VDD, the temperature control can be performed with higher accuracy.

Note that, in the sixth and seventh embodiments, each of the temperature control circuits 2-4 and 2-5 can control with higher accuracy so that an ambient temperature of the integrated circuit IC coincides with an intended temperature. Thus, applying each of the temperature control circuits 2-4 and 2-5 to an optional circuit requiring temperature control, such as an oscillation control circuit that controls the oscillation frequency of a resonator, for example, as in the oscillation control circuit 1-1 of the first embodiment enables suppression of characteristic fluctuation due to temperature fluctuation in the optional circuit.

Eighth Embodiment

Next, an eighth embodiment of the present invention will be described.

Figure 16:
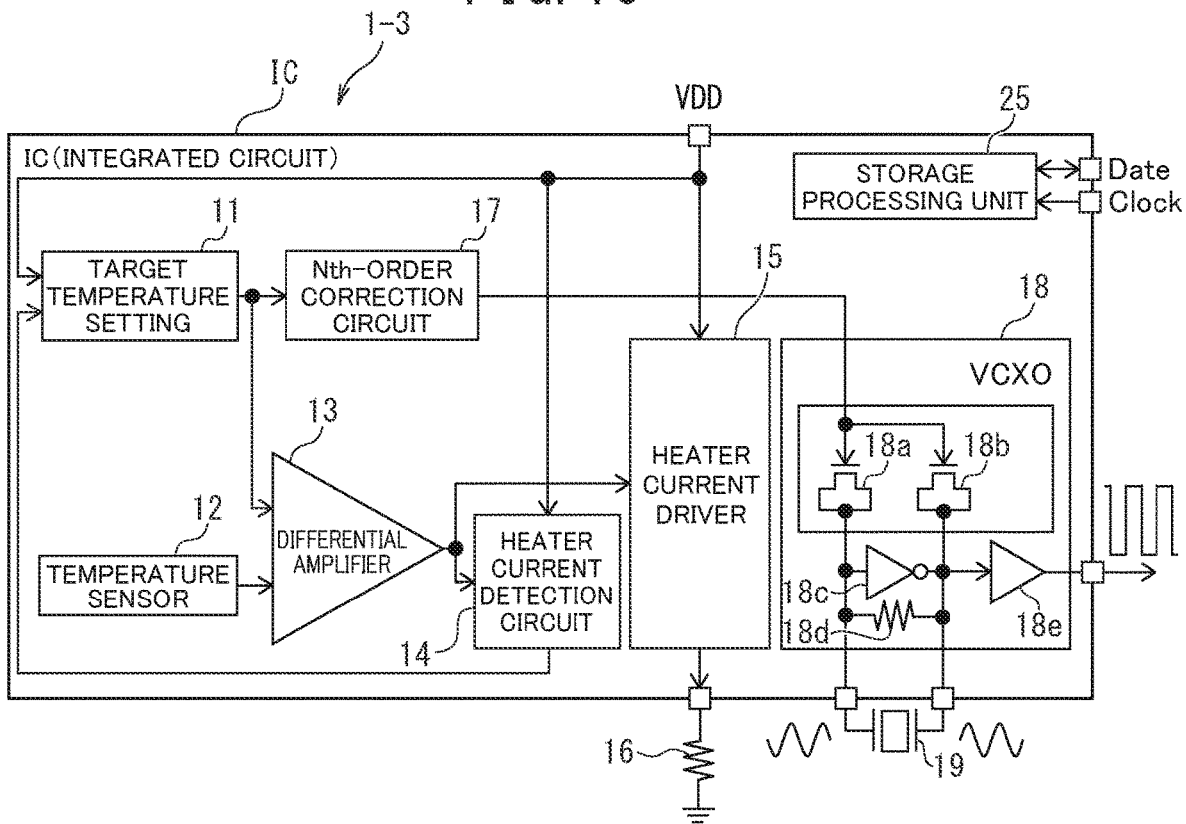
FIG. 16 is a block diagram illustrating an example of a temperature control circuit according to an eighth embodiment of the invention.
Figure 17:
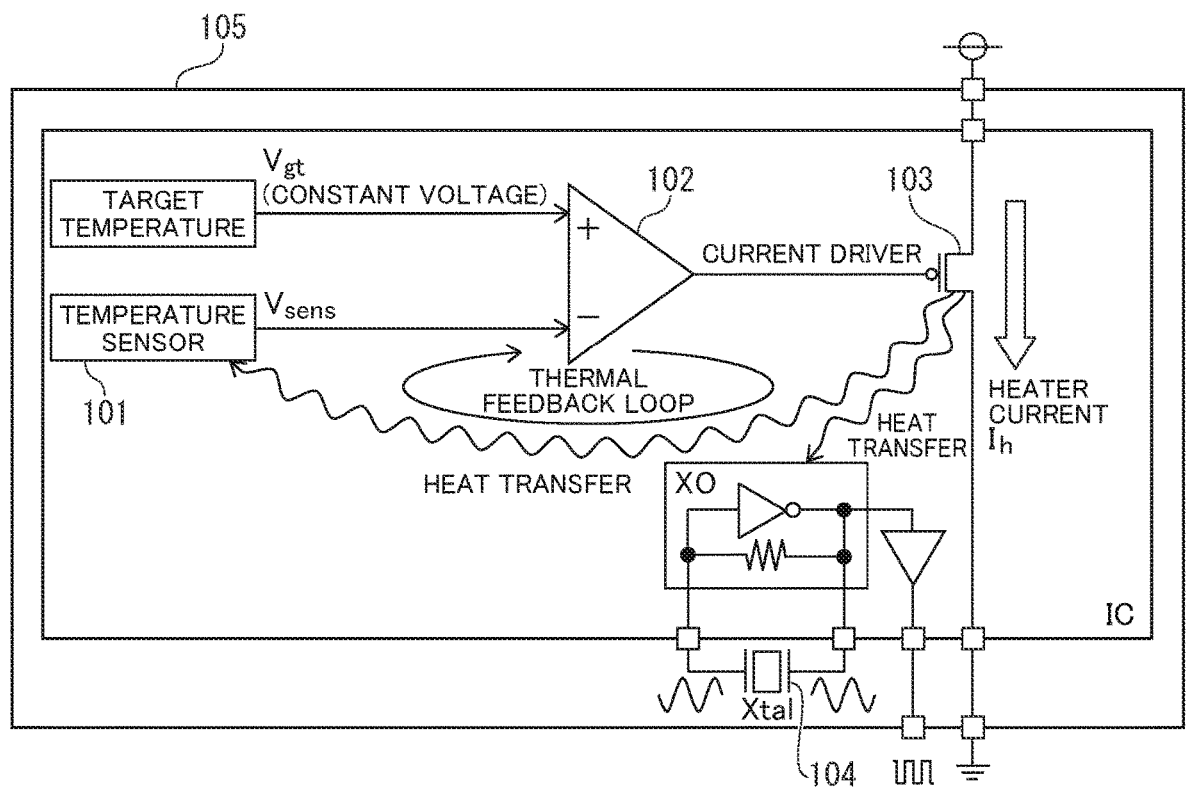
FIG. 17 is an illustrative diagram used to illustrate operation of a conventional oscillation control circuit.
Figure 18:
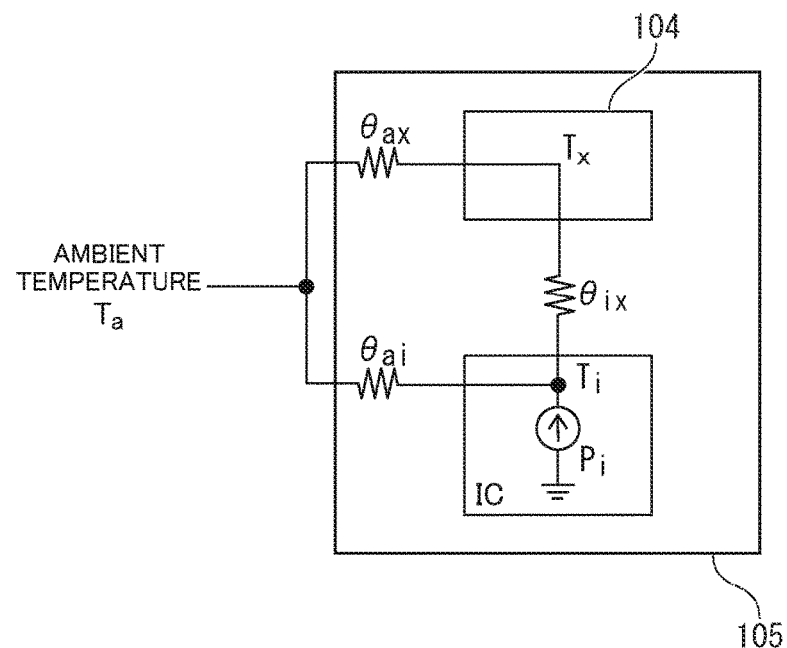
FIG. 18 is an example of a thermal resistance model of the conventional oscillation control circuit.

As illustrated in FIG. 16, the eighth embodiment is different from the oscillation control circuit 1-1 illustrated in FIG. 5 in that a storage processing unit 25 including a nonvolatile memory and an interface accessing the nonvolatile memory is included.

In an oscillation control circuit 1-3 according to the eighth embodiment, the storage processing unit 25 stores, in the nonvolatile memory, correction data for correcting the output of the Nth-order correction circuit 17 according to variation between individual products, and the like and adjustment data such as data for adjusting various manufacturing variations in respective units included in the oscillation control circuit 1-3.

In an unillustrated control device performing control of the oscillation control circuit 1-3, for example, various kinds of adjustment data are detected and stored in the nonvolatile memory of the storage processing unit 25 before shipping, and after shipping, oscillation control is performed using the various kinds of adjustment data stored in the nonvolatile memory of the storage processing unit 25. This can reduce errors due to influence of the variation between the individual products, and the like, which, in other words, can further improve control accuracy of the oscillation control circuit 1-3.

Note that while the eighth embodiment has been described as the case of application to the oscillation control circuit 1-1, the invention is not limited thereto. The eighth embodiment can be applied to the oscillation control circuit 1-2 or each of the temperature control circuits 2-1 to 2-5 in the second to seventh embodiments. Even in these cases, there can be obtained functions and effects equivalent to those of the oscillation control circuit 1-3 according to the eighth embodiment.

Additionally, while the above embodiments have been described using the case where the detection signal of the temperature sensor 12, the output signal of the target temperature generation circuit 11, and the output signal of the heater current detection circuit 14 are corrected by the Nth-order correction circuit 17 or 17a, the present invention is not limited thereto. For example, it is also possible to correct signals between the differential amplifier 13 and the heater current driver 15. In a control system for heater current or in a control system for the resonator 19 if the resonator 19 is included, correction may be made at a place where a drive signal of the heater current or the resonator 19 can be corrected to a drive signal added with an Nth-order correction signal.

Furthermore, while the above embodiments have been described using the case where the resonator is the target object to be subjected to temperature control, the present invention is not limited to resonator, and a piezoelectric element or the like may be subjected thereto.

Although several embodiments of the present invention have been described hereinabove, the above embodiments exemplify devices and methods for embodying a technological idea of the present invention, and the technological idea of the present invention is not to be construed as limiting materials, shapes, structures, arrangement, and the like of the components. The technological idea of the present invention may be modified in various ways within the technological scope defined by the appended claims.

REFERENCE SIGNS LIST

1-1 to 1-3: Oscillation control circuit
2-1 to 2-5: Temperature control circuit
11, 11a: Target temperature generation circuit
12: Temperature sensor
13: Differential amplifier
14: Heater current detection circuit
15: Heater current driver
16: Heater resistor (heater)
17, 17a: Nth-order correction circuit
18: Oscillation circuit
19: Resonator
21: Adder
22: Heater current detection circuit
23: Current-to-voltage conversion circuit
24: Multiplier
25: Storage processing unit

The invention claimed is:

1. A temperature control circuit of a module including a target object and a heat generation circuit stored in a package, the temperature control circuit comprising:
    a temperature sensor arranged in the package and configured to detect temperature in the package;
    a driving amount detection circuit configured to detect a driving amount of the heat generation circuit;
    a target temperature generation circuit configured to generate a target temperature from an intended temperature of the target object and a detection value of the driving amount detected by the driving amount detection circuit;
    a drive circuit configured to control the driving amount so that the detection temperature detected by the temperature sensor coincides with the target temperature; and
    a cancellation circuit configured to receive the detection value of the driving amount or a signal based on the target temperature and cancel influence of a second or higher order fluctuation component generated in the driving amount detection circuit on temperature of the target object.

2. The temperature control circuit according to claim 1, wherein the cancellation circuit includes a first Nth-order component generation circuit configured to generate a second or higher Nth-order component that does not include a first-order component from the detection value of the driving amount and an addition circuit configured to add the Nth-order component generated by the first Nth-order component generation circuit to the detection signal of the temperature sensor.

3. The temperature control circuit according to claim 1, wherein the cancellation circuit includes a second Nth-order component generation circuit arranged between the target temperature generation circuit and the drive circuit and configured to generate a second or higher Nth-order component including a first-order component from the signal based on the target temperature, and outputs the Nth-order component generated by the second Nth-order component generation circuit as the signal based on the target temperature to the drive circuit.

4. The temperature control circuit according to claim 1, wherein the cancellation circuit includes a second Nth-order component generation circuit arranged between the driving amount detection circuit and the target temperature generation circuit and configured to generate a second or higher Nth-order component including a first order component from the detection value of the driving amount, and outputs the Nth-order component generated by the second Nth-order component generation circuit as the detection value of the driving amount to the target temperature generation circuit.

5. The temperature control circuit according to claim 1, further comprising a power supply fluctuation cancellation circuit configured to cancel influence of a fluctuation component generated by a power supply voltage fluctuation included in the signal generated by the cancellation circuit on the temperature of the target object.

6. The temperature control circuit according to claim 5, wherein the power supply fluctuation cancellation circuit includes a multiplier configured to multiply the signal input to the cancellation circuit by the power supply voltage.

7. An oscillation control circuit comprising the temperature control circuit according to claim 1, a resonator that is the target object arranged in the package, and an oscillation circuit configured to control the resonator.

8. The oscillation control circuit according to claim 7, wherein the cancellation circuit includes a first Nth-order component generation circuit configured to generate a second or higher Nth-order component that does not include a first-order component from the signal based on the target temperature, and outputs the Nth-order component generated by the first Nth-order component generation circuit to the oscillation circuit, the oscillation circuit cancelling a frequency fluctuation of the resonator due to temperature according to the Nth-order component.

9. The oscillation control circuit according to claim 7, further comprising a power supply fluctuation cancellation circuit configured to cancel influence of a fluctuation component generated by a power supply voltage fluctuation included in the signal generated by the cancellation circuit on the resonator.

10. The oscillation control circuit according to claim 9, wherein the power supply fluctuation cancellation circuit includes a multiplier configured to multiply the signal input to the cancellation circuit by the power supply voltage.

11. A temperature control method for a module including a target object and a heat generation circuit stored in a package, the temperature control method comprising:

detecting, by a temperature sensor arranged in the package, temperature in the package;

detecting, by a driving amount detection circuit, a driving amount of the heat generation circuit;

generating, by a target temperature generation circuit, a target temperature from an intended temperature of the target object and a detection value of the driving amount detected by the driving amount detection circuit;

controlling, by a drive circuit, the driving amount so that the detection temperature detected by the temperature sensor coincides with the target temperature; and canceling influence of a second or higher order fluctuation component generated in the driving amount detection circuit on temperature of the target object by adjusting the detection signal of the temperature sensor or the target temperature using the detection value of the driving amount or a signal based on the target temperature.

* * * * *